United States Patent
Eder et al.

(10) Patent No.: US 11,472,673 B2
(45) Date of Patent: Oct. 18, 2022

(54) METHOD AND DEVICE FOR GENERATING A 3D MODEL OF A BEARING STRUCTURE OF AN ESCALATOR OR A MOVING WALKWAY

(71) Applicant: INVENTIO AG, Hergiswil (CH)

(72) Inventors: Christoph Eder, Vienna (AT); Richard Schütz, Vienna (AT); Thomas Novacek, Schwechat (AT); Georg Wagenleitner, Rossleithen (AT)

(73) Assignee: INVENTIO AG, Hergiswil (CH)

( * ) Notice: Subject to any disclaimer, the term of this patent is extended or adjusted under 35 U.S.C. 154(b) by 273 days.

(21) Appl. No.: 16/488,908

(22) PCT Filed: Feb. 20, 2018

(86) PCT No.: PCT/EP2018/054121
§ 371 (c)(1),
(2) Date: Aug. 26, 2019

(87) PCT Pub. No.: WO2018/153846
PCT Pub. Date: Aug. 30, 2018

(65) Prior Publication Data
US 2020/0293700 A1    Sep. 17, 2020

(30) Foreign Application Priority Data
Feb. 27, 2017    (EP) .................................. 17158053

(51) Int. Cl.
*B66B 25/00*      (2006.01)
*G01B 21/06*      (2006.01)
(Continued)

(52) U.S. Cl.
CPC ............ *B66B 25/006* (2013.01); *B66B 31/00* (2013.01); *G01B 21/06* (2013.01); *G06F 30/13* (2020.01)

(58) Field of Classification Search
CPC ....... B66B 25/006; B66B 23/00; B66B 23/02; G01B 21/06; G06T 19/20; G06T 2207/10028; G06F 30/13; G01C 11/02
See application file for complete search history.

(56) References Cited

U.S. PATENT DOCUMENTS 6,685,002 B1 *    2/2004    Nurnberg ................ B66B 21/00
                                                          198/321
7,427,916 B2 *    9/2008    Matsumoto ............ G01D 9/005
                                                          340/3.1
(Continued)

FOREIGN PATENT DOCUMENTS

CN          1315715 C        5/2007
CN          101743188 A      6/2010
(Continued)

OTHER PUBLICATIONS

Soni, A. "Non-Contact Monitoring of Railway Infrastructure with Terrestrial Laser Scanning and Photogrammetry at Network Rails" Thesis, U. College London (2016) (Year: 2016).*
(Continued)

*Primary Examiner* — Jay Hann
(74) *Attorney, Agent, or Firm* — Knobbe Martens Olson & Bear LLP (57) ABSTRACT

A method and a device are described for measuring structural components of a bearing structure of an escalator or moving walkway without specialized personnel having to carry out precise measurements in situ. The method comprises fixing an image recording device on a conveying means of the escalator, removing at least one of the tread units of the escalator in order to enable visual access to structural components beneath it; moving the conveying means together with the image recording device at least over partial areas of a travel path, recording images of the structural components to be measured with the image (Continued)

recording device, and generating a 3D model of at least a partial area of the structural components of the bearing structure based on the recorded images. Using the 3D model experts can then measure dimensions and spatial arrangements of structural components without having to be in person at the actual location.

15 Claims, 2 Drawing Sheets

(51) Int. Cl.
*B66B 31/00* (2006.01)
*G06F 30/13* (2020.01)

(56) References Cited

U.S. PATENT DOCUMENTS

| | | | |
|---|---|---|---|
| 8,240,452 B2 | 8/2012 | Fischer et al. | |
| 10,387,582 B2* | 8/2019 | Lewis | G06T 7/55 |
| 10,509,120 B2* | 12/2019 | Bilik | G01S 7/4026 |
| 10,954,102 B2* | 3/2021 | Yamada | B66B 25/006 |
| 2002/0166220 A1* | 11/2002 | Imundo | B64F 5/40 |
| | | | 29/402.09 |
| 2005/0088520 A1 | 4/2005 | Wiesinger et al. | |
| 2010/0091015 A1* | 4/2010 | Heidel | G06T 15/00 |
| | | | 345/419 |
| 2016/0368741 A1 | 12/2016 | Blondiau et al. | |
| 2021/0157312 A1* | 5/2021 | Cella | G06K 9/00637 |
| 2021/0173380 A1* | 6/2021 | Zimmermann | B33Y 50/00 |

FOREIGN PATENT DOCUMENTS

| | | | |
|---|---|---|---|
| EP | 0644498 A2 * | 3/1995 | G06F 30/00 |
| EP | 2 933 779 | 10/2015 | |
| JP | 2000159470 A * | 6/2000 | B66B 31/00 |
| JP | 2003176090 A | 6/2003 | |
| JP | 2015 030604 | 2/2015 | |
| JP | 2015 202915 | 11/2015 | |
| TW | 201534549 | 9/2015 | |
| WO | WO 2004/035452 A1 | 4/2004 | |
| WO | WO 2014027144 A1 | 2/2014 | |
| WO | WO 2016199850 A1 | 12/2016 | |
| WO | WO 2017/220650 | 6/2017 | |

OTHER PUBLICATIONS

English machine translation of JP-2000159470-A Yoshikawa above. (Year: 2000).*
International Search Report for International Application No. PCT/EP2018/054121 dated May 7, 2018.

* cited by examiner

METHOD AND DEVICE FOR GENERATING A 3D MODEL OF A BEARING STRUCTURE OF AN ESCALATOR OR A MOVING WALKWAY

TECHNICAL FIELD

The present disclosure relates to a method and a device for generating a 3D model of structural components of a bearing structure of an escalator or moving walkway and for measuring the structural components, such as it can be used, in particular, in the process of modernizing an escalator or moving walkway.

SUMMARY

Travelling facilities in the form of escalators or moving walkways are used inside buildings for the purpose of conveying people between two fixed locations. In the case of escalators, also called rolling stairs, the two locations are at different levels and people are conveyed along a conveying path with a marked incline, whereas in the case of moving walkways the two locations are at the same level or at two only slightly different levels and people are conveyed horizontally along a merely slightly inclined conveying path. In the following escalators and moving walkways are summarised under the more general term "travelling facilities."

A travelling facility generally includes a conveying means (or assembly or device) with a number of movable tread units along a revolving travel path. The tread units are accessible from outside at least within a so-called conveying region, so that passengers arriving via an entry region can step on one of the tread units in the conveying region, are then conveyed along the conveying path and can ultimately leave again in an opposite exit region. Sometimes the conveying region of the conveying means is also called the leading run, wherein the conveying means as it revolves and returns underneath the leading run, is then called the return run, where, of course, it cannot be used by passengers. With escalators, the tread units are usually called steps, whilst with moving walkways the tread units are often called pallets. The tread units are generally arranged one behind the other along the travel path and are each attached to a chain or a belt, thereby forming a stair belt or pallet belt. The conveying means formed by the stair belt or the pallet belt can thus be understood as that part of the travelling facility, which can be moved relative to a stationary part of the travelling facility. The travelling facility also comprises revolving handrails as standard, which run longitudinally along the side of the stair belt or the pallet belt. The user can hold onto these, wherefore the revolving handrails can also be part of the conveying means.

In addition to the conveying means the travelling facility has a bearing structure, with the aid of which the travelling facility can be fastened within the building and via which the weight of the travelling facility is transferred to the building. The bearing structure is configured as a framework. Such a framework is composed of a plurality of structural components. Such structural components may be, among others, transverse struts, longitudinal struts, diagonal struts, adapter parts and the like. The framework is designed and arranged in such a way that on the one hand it can be mounted to bearing structures of the building, and on the other hand, components of the conveying means can be mounted to the framework. A geometric and structural design of the structure formed by the framework should therefore take account of both the geometric and structural marginal conditions within the receiving building and the corresponding realities of other components of the travelling facility, such as in particular the conveying means.

After an escalator or a moving walkway has been in operation for a certain amount of time it may be necessary to modernize it. This may involve for example, the replacement of worn components of the travelling facility. Alternatively or additionally components of the travelling facility may be replaced by corresponding components of more modern design, in order, for example, to improve a performance, comfort or longevity of the original travelling facility.

As an alternative to modernizing an existing travelling facility the same may be replaced in its totality. With this scenario, admittedly, it may be more cost-effective to manufacture a replacement travelling facility as standard in a factory instead of modernizing an existing travelling facility. However, additional expenditure and costs may occur which are caused by transporting the replacement travelling facility to its place of use. In particular, considerable expenditure may be incurred as a result of installing a replacement travelling facility as a very large component in an existing building, since it may often be necessary to at least partially remove walls of the building and/or other obstructions.

Modernization of a travelling facility typically involves firstly removing an existing bearing structure of the travelling facility, in particular an existing framework, e.g., in particular components of the travelling facility which are to be modernized. In particular some or all components of the conveying means, e.g., the stair belt or the pallet belt and/or drive units and/or redirecting units are removed. Subsequently the remaining bearing structure of the travelling facility is prepared for the installation of new components, e.g., it is in particular cleaned and possibly fitted with suitable adapter plates or adapter modules in order to be able to subsequently install new components in the bearing structure.

WO 2004/035452 A1 describes a method for modernizing an existing escalator. EP 16175491.6 also describes a method for modernizing an existing escalator or an existing moving walkway.

Traditionally, modernizing an existing travelling facility involves removing the components to be replaced followed by accurately measuring the remaining framework, so that this can be adapted for receiving replacement components at a later stage, for example, by means of adapter plates and adapter modules. This measuring is traditionally carried out by specialized personnel, who, for example, have in-depth knowledge of both the replacement components and their installation requirements, and who know which dimensions of the remaining bearing structure need to be measured, in order to prepare for the installation of the replacement components and for the construction or adjustment of adapter plates and adapter modules, as required, with sufficient accuracy at a later stage. Due to the required expertise of skilled personnel as well as the necessity for the skilled personnel to inspect and measure the travelling facility in situ, this measuring work has been both expensive and time-consuming.

There may be, among others, a requirement or desire for a method or a device, with the aid of which, in particular, in terms of modernization measures, a bearing structure or an escalator or moving walkway can be measured at small HR and/or financial expense with regard to their structural components. In particular there may be a requirement for as method or a device, by which the structural components of the bearing structure of the travelling facility can be measured without the need for qualified skilled personnel to measure the travelling facility in situ.

Such a requirement or desire may be met by the method or the device as described herein. Advantageous embodiments are defined throughout the application.

According to a first aspect, a method is proposed for generating a 3D model of structural components of a bearing structure of an escalator or a moving walkway. The escalator or moving walkway comprises a conveying means with a number of tread units, wherein the tread units are arranged one behind the other along a travel path. The method comprises: (a) fixing an image recording device to the conveying means; (b) removing at least one of the tread units, in order to enable visual access to structural components underneath it; (c) prior to taking image recordings with the image recording device, immovably affixing at least one reference mark on the escalator or moving walkway at at least one location within the travel path, wherein the reference mark is clearly identifiable for the image recording device; (d) moving the conveying means together with the image recording device in a revolving manner at least over partial areas of the travel path; (e) taking image recordings of the structural components to be measured by means of the image recording device from several positions along the travel path; and (f) generating the 3D model at least of partial areas of the structural components of the bearing structure based on the recorded image recordings and with the aid of the at least one reference mark recorded in conjunction therewith. The steps can be performed in the sequence indicated or in another sequence. In particular step (b) can be performed before step (a). The steps (d), (e), (f) can be performed one after the other or simultaneously.

With respect to this specification the term "3D model" is understood to mean a virtual 3D model. More precisely this 3D model, as far as possible, is a true-to-scale three-dimensional reproduction of the recorded structure in digitised form, wherein individual points of the 3D model are defined in the virtual space by coordinates in three dimensions and/or by vector coordinates. Such virtual 3D models can, for example, be transferred into a 3D CAD system. The 3D CAD system (three-dimensional computer aided design system) offers the possibility of measuring distances and positions of surfaces and edges of the 3D model. Preferably the new components to be fitted have also been constructed by means of the 3D CAD system. These can then be virtually inserted into the 3D model and optimally positioned, so that adapter parts can be constructed directly in the virtual environment of the 3D model. These adapter parts allow the old existing framework to be connected to the new components to be fitted in a stable, reliable and positionally precise manner.

According to a second aspect, method is proposed for measuring structural components of a bearing structure of an escalator or moving walkway. The method comprises generating a 3D model of structural components of the bearing structure by means of a method according to an embodiment of the first aspect and measuring the structural components by way of the 3D model.

According to a third aspect, a method is proposed for modernizing an escalator or moving walkway. The method comprises (i) ascertaining dimensions within a bearing structure of the escalator or moving walkway by measuring structural components of the bearing structure using the method according to an embodiment of the second aspect; (ii) removing old components from the escalator or moving walkway attached to the bearing structure; and (iii) affixing new components of the escalator or moving walkway to the bearing structure, wherein positioning of the new structural components on the bearing structure is effected taking into account the previously ascertained dimensions within the bearing structure.

According to a fourth aspect, a device is proposed for generating a 3D model of structural components of a bearing structure of an escalator or moving walkway. The escalator or moving walkway is constructed identically or analogously as described above with respect to the first aspect. The device comprises an image recording device, a fixing means and a computing means. The image recording device is adapted to take image recordings of the structural components to be measured. The fixing means is adapted to fix the image recording device on the conveying means. The computing means is adapted to generate the 3D model at least from partial areas of the structural components of the bearing structure based on the image recordings taken by the image recording device. The device may thus be specifically configured to perform a method according to an embodiment of the first or the second aspect or to be used in such a method.

Possible features and advantages of embodiments of the disclosure can, among others, and without limiting the disclosure, be regarded as being based on ideas and findings described hereunder.

As noted in the beginning, conventional modernization measures, up to now, required remaining structural components of a bearing structure of a travelling facility to be measured by specialized skilled personnel at a great deal of expense, in order to be able to adequately prepare replacement components of the conveying means and fit them into the remaining bearing structure.

Using the method proposed here or using the proposed device it is possible to carry out measuring of the bearing structure of a travelling facility in a considerably simplified and/or partially automated manner.

To briefly summarise, it is proposed to generate a 3D model, e.g., an as-far-as-possible true-to-scale three-dimensional reproduction, of structural components of the bearing structure of the travelling facility, in particular in digitized form, with the aid of image recordings, in order to be able to measure this 3D model. The image recordings are recorded by an image recording device fixed to the conveying means of the travelling facility. In particular, a number of image recordings are recorded, wherein the positions from which the image recordings are recorded, shall be different from each other. To this end the image recording device fixed to the conveying means is moved at least over partial areas of the travel path of the conveying means. For this purpose, the conveying means is moved in a revolving manner and an image recording is recorded at different positions respectively along the travel path. The desired 3D model can then be generated from the plurality of image recordings taken from different angles of view.

As part of the proposed method the image recording device can be fixed in different ways to the conveying means of the travelling facility. It is possible, for example, to attach the image recording device to one of the tread units or pallets. To do this a specially formed coupling device can be used which on the one hand is adapted to cooperate with the image recording device, e.g., is to be fixed, for example, to a foot of the image recording device, and which on the other hand, cooperates with the tread unit, e.g., is to be fixed, for example, in grooves of the tread unit. Alternatively or additionally the image recording device can be fixed to other components of the conveying means. For example, fixing may be envisaged on the stair belt or the pallet belt. In particular fixing may be envisaged on a conveyor chain and/or on connecting axles within the stair belt or pallet belt. It is also feasible to fasten the image recording device on one of the revolving handrails or on both handrails.

By attaching the image recording device to the conveying means, the image recording device can be fixed stationary relative to the conveying means, e.g., a direction of view of the image recording device changes only if the conveying means is moved, and an orientation of view of the image recording device changes only in case a movement direction of the conveying means is to change with regard to its orientation. Such rigid fixing of the image recording device on the conveying means is easy to implement. In particular the image recording device itself may not be able to actively change its direction of view and/or orientation of view, but it may suffice to only move a static image recording device with the aid of the conveying means along partial areas of the travel path of the travelling facility. Besides, rigid fixing of the image recording device on the conveying means may simplify an evaluation or further processing of the image recordings recorded by the image recording device.

By successively moving the image recording device along the travel path, this can record image recordings of different partial areas of the bearing structure of the travelling facility. Since at least parts of this bearing structure and its structural components to be measured are arranged underneath the tread units of the conveying means, at least one of the tread units, preferably two or three tread units are temporarily removed in order to gain visual access to structural components beneath it, which have to be measured. The tread units can be removed relatively easily also by unspecialised personnel. As a result of the opening formed thereby within the conveying means the image recording device can record image recordings of the structural components beneath it.

When the conveying means together with the image recording device and the opening formed in it are moved successively along the travel path of the travelling facility, recordings of image recordings can be taken from different positions and thus in different directions of view. It is not mandatory to map or to record all structural components completely as image recordings, rather it may suffice to merely record in the 3D model those areas of the bearing structure of the travelling facility, which are to be modernized. In this case it may then be, among others, enough to move the image recording device merely over parts of the travel path of the conveying means. It is however assumed as being advantageous to move the image recording device along essentially the entire leading run of the travel path.

According to one embodiment it is proposed to employ an image recording device which is a 3D device designed for recording three-dimensional image recordings.

In other words the image recording device may be designed for the purpose of not merely recording a two-dimensional projection of its field of view, but to map its field of view three-dimensionally in particular in terms of the method proposed here. Three-dimensional image recordings contain information both on lateral distances between objects and on their depth in the space, e.g., their distance to the image recording device. Preferably the 3D image recording device is able to record the three-dimensional image recordings true-to-scale. The 3D model can then be generated in a relatively easy manner from the three-dimensional image recordings recorded at different positions along the travel path.

An image recording device may, for example, be a laser scanner. Such a laser scanner emits a laser beam and moves it (scans) successively through its field of view. Parts of the laser beam which are reflected back, are detected with an image of the environment within the field of view being generated therefrom. In the case of a laser scanner information is additionally ascertained on distances of objects relative to the laser scanner within the field of view. To this end, runtimes, for example, of the emitted laser beam until detection of the back-reflected parts can be measured.

Alternatively the image recording device may be configured as a camera. Such a camera can simultaneously record an image of its environment in its entire field of view. A 3D camera can generate image recordings, in which for each recorded surface information is ascertained also on its distance to the camera. This can be done by using runtime measurements, among others. Therefore such cameras are sometimes called TOF cameras (time-of-flight).

It is pointed out that admittedly it might be advantageous to generate the desired 3D model from 3D image recordings, e.g., that the image recording device used is a 3D image recording device such as a 3D laser scanner or a TOF camera. In principle however it is also thought possible to create the 3D model from 2D image recordings, which are taken from different directions of view, e.g., from different positions. To this end the 3D model generated from 2D image recordings can be ascertained, for example, by means of stereoscopic techniques.

The 3D model generated in the above-described manner can then be used for measuring the structural components of the bearing structure reproduced in there. To do this the 3D model can, for example, be generated and/or processed in a CAD system (computer aided design).

Measuring of the 3D model can be advantageously effected at a location remote from the travelling facility. This may have the advantage that there is no need for expensive personnel skilled in the art of measuring a 3D model, to travel in person to the location of the travelling facility.

In other words, it may suffice that an auxiliary unskilled person temporarily removes one of the steps in the travelling facility and, for example, fixes the image recording device to a step which due to the opening created is now an adjacent step and then performs a movement operation, in which the conveying means of the travelling facility is briefly moved so that the image recording device fixed to it can record image recordings from different positions. To perform these actions, auxiliary staff only needs very basic technical knowhow. In particular there is no need for auxiliary staff to have any specialized knowledge of the measuring of existing travelling facilities. The image recordings generated with the aid of the image recording device or the 3D model generated therefrom can then be transmitted, for example, via a data network to the CAD system of a measuring specialist. This measuring specialist does not in person have to inspect the travelling facility in situ, but can measure the structural components of the bearing structure with sufficient accuracy, merely using the generated 3D model.

As mentioned further above, prior to recording image recordings, a reference mark clearly identifiable for the image recording device is immovably affixed on the escalator or the moving walkway in a place within the travel path or a number of reference marks clearly identifiable for the image recording device are affixed on the escalator or moving walkway in different places along the travel path.

In other words the travelling facility, prior to the start of taking image recordings, can be suitably prepared by affixing one or more reference marks, in order to, for example, be able subsequently to generate the desired 3D model from the recorded image recordings in a simpler and/or more precise manner and/or in order to be able to better evaluate it. When generating the 3D model the reference marks can then be used, for example, for orientation, for forming a standard or similar.

The reference marks may be in the form of self-adhesive or easy-to-attach markers. The reference marks may be provided with patterns, barcodes or similar features. The patterns or barcodes may be different from each other so that they can be clearly distinguished from one another. The reference marks may also be designed as centring marks, similar, for example, to a target.

The reference marks can be attached in predetermined positions along the travelling facility. Alternatively, reference marks can be attached in random positions on the travelling facility. In particular, the reference marks may be attached to parts of the balustrade and/or the structural components to be measured. Positions of the reference marks relative to each other can be precisely measured as required. What is important is merely the positions or distances of the reference marks relative to one another, an absolute positioning of the reference marks on the travelling facility is of little or no relevance.

According to one embodiment, when generating a 3D model, a number of image recordings can be combined to form one overall image, taking into account the reference marks recorded along with the image recordings.

In other words, the reference marks previously attached to the travelling facility can be utilized to combine a number of individually recorded image recordings to form one overall recording from which the 3D model is then generated. It may be advantageous to arrange the reference marks in such a way on the travelling facility along the travel path and/or to record image recordings along the travel path in suitable positions in such a way that each recorded image recording also comprises at least one, preferably at least two, reference marks. In particular, if the reference marks are each designed in a different way and thus are distinguished from one another, it can be unequivocally ascertained based on the reference marks recorded along with the image recordings, at which position an image recording has been recorded and how this can be combined with other image recordings.

According to one embodiment, is possible during generating the 3D model to correct distortions in the image recordings using the reference marks recorded along with the image recordings.

In a similar way as with the previously described embodiment, the reference marks can thus be utilized for the purpose of generating the 3D model. Taking into account the already known positions and/or already known distances of the reference marks it is possible to detect as to whether distortions have occurred in the image recordings, caused, for example, by optical errors of the image recording device. In particular it may be important, on the basis of the recorded image recordings, to be able to draw conclusions as to the actual dimensions and geometries of the structural components and thus to distinguish virtual recording errors in the form of distortions from real geometries of the structural components. For example, structural components, which originally were formed as struts or bars could, in the course of time, deform or bend out of shape. The image recordings would then reveal bent structural components. On the other hand the structural components could be straight as before and merely appear bent in the image recordings due to optical distortions. With the aid of previously attached reference marks these virtual distortions can then be distinguished from actual distortions. Suitable calculations can be carried out to remove these distortions, thereby improving the accuracy or adherence to scale of the generated 3D model.

With a further possible embodiment, the generated 3D model can be calibrated by way of the reference marks recorded together with the image recordings.

In other words, the reference marks attached to already known or accurately measured positions can be used to calibrate the generated 3D model. In such a calibrated 3D model the dimensions of structural components or distances between structural components are, in particular, reproduced true to scale, so that such dimensions or distances can be accurately measured with the aid of the 3D model.

According to one embodiment, the image recordings can be recorded during the continuous movement of the conveying means.

Expressed in another way, the conveying means can be moved in a continuously revolving manner taking the image recording device fixed to it along with it so that this is continuously moved for example, from a first extreme position to a second extreme position, for example, from a start of the conveying region to an end of the conveying region. While travelling along the travel path between the two extreme positions the image recording device is then able to record a number of image recordings from different positions. It is not mandatory for the conveying means to be stopped so that the movement duration can be kept short and/or a control of the travelling facility can be kept simple.

Alternatively, according to one embodiment, movement of the conveying means can be temporarily interrupted whilst image recording is taking place.

In other words the image recording device can be moved again by the conveying means from one position to a second position. However, this means that the operation of moving the conveying means is briefly interrupted one or more times, e.g., the conveying means is briefly stopped so that the image recording device can record image recordings during a standstill. A quality of the image recordings can generally be improved thereby because blurring, for example, which would be due to juddering or wobbling of the image recording device is avoided.

According to one embodiment, the image recording device may exchange signals with a control of the escalator or the moving walkway in order to coordinate the recording of image recordings with the movement operation of the conveying means.

Expressed another way, the image recording device and the control of the travelling facility may be in communication with each other such that the image recording device can, for example, take image recordings in dependence of a current movement state of the conveying means. For example, the image recording device can detect based on signals received from the control of the travelling facility when it has reached a certain position and can then, from this position, record an image recording. Alternatively or additionally the image recording device, by way of signal transmission, can cause the control of the travelling facility to stop briefly in order to take an image recording. The image recording device and the control of the travelling facility can communicate with each other in different ways, for example, via a cable connection to be installed in advance, or alternatively via, for example, a wireless radio link.

According to one embodiment, the image recording device may be arranged to detect one end of the conveying region and thereupon signal to the control of the escalator/moving walkway to stop moving the conveying means.

In other words, the image recording device can detect, for example, by way of image recordings taken when it is approaching the end of the conveying region. The image recording device being in communication with the control of the travelling facility can then direct the control to stop the travelling facility.

The image recording operation can thus, for example, be started by a person as soon as the image recording device is correctly fixed to the conveying means, and at the same time or subsequently the control of the conveying means can be triggered accordingly in order to convey the image recording device along the travel path. When the image recording device has reached, for example, an opposite end of the travel path or the conveying region or is approaching the same, the image recording device can communicate this autonomously to the control of the travelling facility and instruct it to stop the conveying operation. The image recording device can then be dismantled again from the conveying means. This is a way of simplifying the entire process. In particular this is a way of avoiding damage to the image recording device through collision with parts of the travelling facility.

It is pointed out that some of the possible features and advantages of the disclosure have been described here with respect to different embodiments. In particular some features have been described with respect to an inventive method and other features have been described with respect to an inventive device. An expert will recognise that the features can be combined, adapted or swapped in a suitable manner in order to arrive at further embodiments of the disclosure.

BRIEF DESCRIPTION OF THE DRAWINGS

Embodiments of the disclosure will now be described with reference to the attached figures, wherein neither the drawings nor the description should be interpreted as limiting the disclosure.

The figures are only schematic depictions and not drawn true-to-scale. Identical reference symbols denote identical or identically functioning features in the different figures.

DETAILED DESCRIPTION

Figure 1:
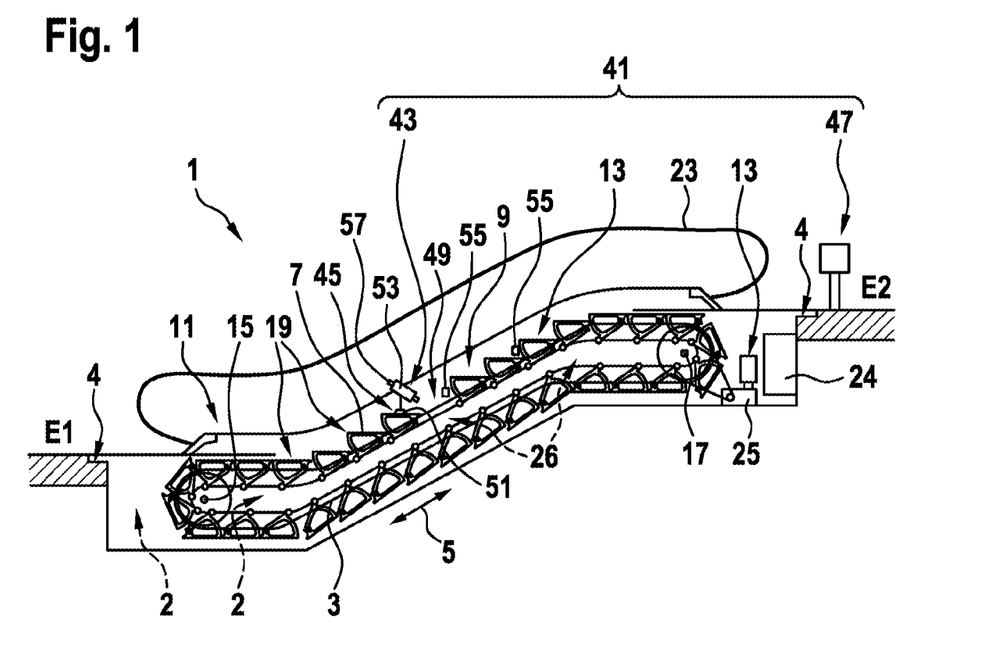
FIG. 1 shows an escalator with a device for generating a 3D model of structural components of a bearing structure of the escalator according to an embodiment of the present disclosure.
Figure 2:
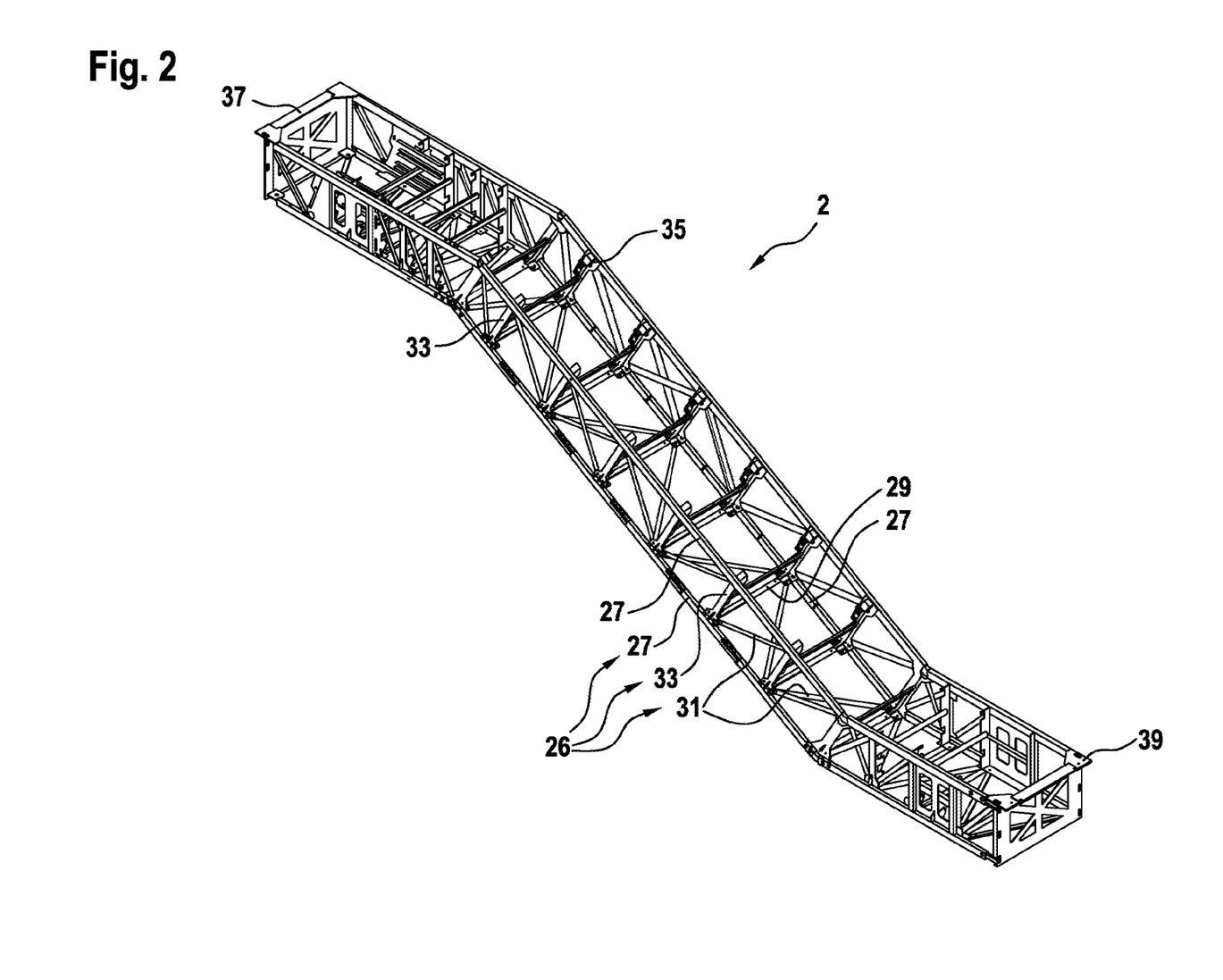
FIG. 2 shows a bearing structure in the form of a framework for an escalator.

FIG. 1 shows an exemplary side view of an escalator 1, with the aid of which people can be transported between two levels E1, E2. FIG. 2 shows a perspective view of a bearing structure 2 in the form of a framework for such an escalator 1. The bearing structure 2 depicted in FIG. 2 is suitable for in particular receiving the components of the escalator 1 shown in FIG. 1 and for fixing these within a building and transferring their weight to the building. The bearing structure 2 and its structural components 26 were shown in FIG. 2 for illustration only and shown in FIG. 1 with only their positions indicated by broken arrows, but they were not shown in any detail in order not to disturb the clarity of FIG. 1.

The escalator 1 comprises two conveyor chains 3 forming a closed ring. The two conveyor chains 3 are composed of a plurality of chain links. The two conveyor chains 3 can be moved along a travel path 5 in movement directions. Across large areas the two conveyor chains 3 run parallel to each other, whilst being spaced apart in one direction transversely to the movement direction. In end areas bordering the levels E1, E2 the conveyor chains 3 are redirected by redirecting wheels 15, 17.

A number of tread units 7 in the form of steps extend between the two conveyor chains 3. Close to its lateral ends each tread unit 7 is attached to respectively one of the conveyor chains 3 and can thus be moved along the travel path 5 in the movement directions. The tread unit 7 guided on the conveyor chains 3 form the transport belt 9, on which the tread units 7 are arranged one behind the other along the travel path 5 and can be stepped on by passengers in at least one conveying region 19. In order to be able to move the conveyor chains 3 the escalator 1 is equipped with a drive arrangement 25 and a control 24 controlling the same (wherein the control is merely schematically indicated in FIG. 1). The transport belt 9 together with the drive arrangement 25 and the redirecting wheels 15, 17 forms a conveying means 13, the tread units 9 of which can be moved relative to the bearing structure 2, which is firmly immovably anchored in the building.

For reasons of clarity, the bearing structure 2 is not shown in FIG. 1, but is shown separately in FIG. 2. The bearing structure 2 is configured as a framework, which is composed of a plurality of structural components 26 such as longitudinal struts 27, transverse struts 29, diagonal struts 31, uprights 33, add-on parts 35, etc. The structural components 26 are rigidly connected with each other, for example, by means of weld, screw, clinch or rivet connections. The bearing structure 2 can be attached at points of attachment 37, 39 to corresponding load-bearing parts 4 (see FIG. 1) of the building.

The various components of the conveying means 13 are connected to the bearing structure 2 and are supported by these. To this end, the components of the conveying means can be attached, for example, by means of adapter plates or the like to one or more structural components.

The escalator 1 also possesses a handrail 23 arranged above a balustrade 11, which generally is driven together with the conveyor chains 3 and thus moves synchronously with the transport belt 9.

After an escalator 1 has been in operation for a certain period of time it may be modernized in order to bring it up-to-date with latest technical standards. This involves an amount of expenditure which is more than that for customary inspection and maintenance work, where merely worn parts need replacing. When modernization is undertaken there is also not infrequently a need for safety elements and electrical equipment to be adapted to the latest requirements and safety standards.

While as part of the modernization measures, components to be replaced traditionally had to be completely removed and the remaining components of the bearing structure 2 precision measured by hand, an alternative method is described here using a device 41. This device 41 is designed to generate a 3D model of the structural components 26 of the bearing structure 2 of the escalator 1, which can then be utilised for measuring purposes.

As schematically shown in FIG. 1, the device 41 comprises an image recording device 43. The image recording device 43 is fixed to the conveying means 13 with the aid of a fixing means. Further the device 41 is equipped with a computing means 47 (e.g., a processor).

As part of the modernization procedure one or a few of the tread units 7 on the escalator 1 to be modernized may be removed in advance by personnel. Generally speaking this can be done by personnel without any specialised knowledge, so that this activity can be performed by, for example, auxiliary staff. In some circumstances covers such as, for example, cover plates of a balustrade base may also be removed. This will expose an opening 49 in the transport belt 9. Through this opening 49 visual access is possible to parts of the structure 2 beneath it.

Subsequently, the image recording device 43 is fixed to the conveying means 13 with the aid of the fixing means 45. The image recording device 43 can be in particular fixed to the conveying means 13 in such a way that its viewing range is directed at the opening 49 and the bearing structure 2 beneath it. To begin with the image recording device 43 may be arranged close to one end of the conveying region 19, for example, in the vicinity of the access to the lower level E1.

In the example shown, the fixing means 45 is designed in the form of a foot 51, which on the one hand is designed to support the image recording device 43, and which on the other hand is designed to be attached to one of the tread units 7. The foot 51 may engage, for example, in grooves within the tread unit 7.

Alternatively, the fixing means 45 may be designed to cooperate, not with one of the tread units 7, but with other components of the transport belt 9, for example, with a conveyor chain 3 or axles joining thereto. It is also possible to attach the fixing means to the handrails or handrail belts arranged thereon in a revolving manner.

As soon as the opening 49 is generated through the removal of tread units 7 and the image recording device 43 is attached to the conveying means 13, the image recording device 43 can be successively moved along the travel path 5 within the conveying region 19. With this arrangement, a viewing range of the image recording device 43 may be directed through the opening 49 at structural components 26 beneath it and take image recordings thereof.

Preferably, the image recording device 43 may be designed to take 3-dimensional (3D) images of the bearing structure 2 within its viewing range. To this end, the image recording device 43 may, for example, be configured as a 3D laser scanner or a TOF camera 53.

In order to take image recordings along, as far as possible, the entire bearing structure 2, the image recording device 43 fixed to the conveying means 13 can be moved together with the transport belt 9 successively along the travel path 5 within the conveying region and in the process take a number of image recordings from different positions.

Data or signals associated with the image recordings can then be transmitted to the computing means 47. The computing means 47 may be directly provided on the image recording device 43 or even be integrated therein. In this case, the 3D model can be generated directly in the image recording device 43 equipped with the computing means 47. Subsequently, the generated 3D model may be transmitted to a control centre, as required, in order to evaluate it in there.

Alternatively, the computing means 47 may be provided as a separate unit, as shown by way of example in FIG. 1. Such a separate computing means 47 may, for example, be arranged in the vicinity of the escalator 1 and communicate with the image recording device 43, for example, via a wireless data link. Alternatively, the computing means 47 may be arranged at a more remote location, for example, in a control centre which is situated outside the building or even in another town. In this case, data and signals of the image recording device 43 can, for example, be transmitted via a wired or wireless network to the computing means 47.

The image recording data obtained from the image recording device 43 may be used to generate a three-dimensional model of the bearing structure 2 of the escalator 1 within the computing means 47. The dimensions of individual structural components 26 and/or their position and orientation relative to one another can then be precisely measured using this 3D model.

Based on the measured data obtained in this way, experts can then make preparations in order to replace old components of the conveying means 13 by new components, once the old components have been removed. In particular, the new components or adapter pieces or the like for installing them can be suitably dimensioned or adapted, to enable them to be fitted quickly and without problems on site into the remaining bearing structure 2.

In order to be able to simplify or refine the recording of image recordings and the generating of the 3D model based on a number of recorded image recordings, a number of clearly identifiable reference marks 55 may preferably be arranged prior to the recording procedure along the travel path 5 in the conveying region 19. The reference marks 55 may, for example, be provided as stickers with a uniquely assigned code, e.g., a barcode or QR code.

The reference marks may be arranged in such a way that they lie within the field of view of the image recording device 43, at least if this is arranged in certain recording positions. The recording positions can be chosen such that each image recording includes at least one reference mark 45, preferably at least two reference marks 55.

Including the reference marks 55 in the recording makes it easier to subsequently generate and/or calibrate an overall picture from the individual image recordings and/or remove by calculation any distortions caused, for example, by recording errors.

As the case may be, the image recording device 43 may further be designed to communicate with the control 24 of the escalator 1 with the aid of a signal exchange unit 57. For example, the control 24 can be directed to stop the drive arrangement 25 of the escalator 1 every time the image recording device 43 has reached a certain position so that the image recording device 43, when at a standstill, can record image recordings without wobbling at these positions. Furthermore the image recording device 43 can direct the control 24 to stop the operation of the drive arrangement 23 as soon as the image recording device 43 has passed through the entire conveying region 19 and is, for example, approaching the opposite end thereof.

Finally it is pointed out that terms such as "comprising," "including," etc., do not exclude any other elements or steps and terms such as "a" or "one" do not exclude a plurality. Furthermore, it is pointed out that features or steps which have been described with reference to one of the above exemplary embodiments, can be used also in combination with other features or steps of other above-described exemplary embodiments. Reference symbols in the claims are not to be regarded as restrictions.

The invention claimed is:

1. A method for generating a 3D model of structural components of a bearing structure of an escalator or a moving walkway to prepare for installation of replacement components to be installed on the bearing structure with adapter plates or modules, wherein the escalator or the moving walkway comprises a conveying assembly with a plurality of tread units moveable along a revolving travel path, the method comprising:
   fixing an image recording device on the conveying assembly;
   removing at least one of the tread units to enable visual access underneath the tread units to structural components which shall be measured;

prior to recording image recordings, immovably affixing at least one reference mark on the escalator or on the moving walkway in at least one place within the travel path, wherein the reference mark is clearly identifiable for the image recording device;

moving the conveying assembly together with the image recording device over at least partial areas of the travel path in a revolving manner;

recording image recordings of the structural components to be measured using the image recording device at a number of positions along the travel path;

effecting the generation of the 3D model at least of partial areas of the structural components of the bearing structure based on the recorded image recordings and with the aid of at least one reference mark recorded together with the images;

generating or inserting into the 3D model a component model of at least one replacement component to be installed on the bearing structure; and generating, based on the 3D model and the component model, an adapter plate or adapter module model configured to fit and attach the replacement component to the bearing structure, wherein the image recording device exchanges signals with a control of the escalator or the moving walkway in order to coordinate the recording of image recordings with the movement of the conveying assembly.

2. The method according to claim 1, wherein, in generating the 3D model, a number of image recordings are combined to form one overall recording taking account the reference marks recorded along with the images.

3. The method of claim 2, wherein, in generating the 3D model, distortions in the image recordings are corrected by way of the reference marks recorded along with the images.

4. The method of claim 3, wherein the generated 3D model is calibrated by way of reference marks recorded along with the images.

5. The method of claim 1, wherein, in generating the 3D model, distortions in the image recordings are corrected by way of the reference marks recorded along with the images.

6. The method of claim 1, wherein the generated 3D model is calibrated by way of reference marks recorded along with the images.

7. The method of claim 1, wherein the image recordings are recorded during the continuous movement of the conveying assembly.

8. The method of claim 1, wherein movement of the conveying assembly is temporarily interrupted during the recording of image recordings.

9. The method according to claim 1, wherein the tread units can be stepped on by passengers at least in a conveying region and the image recording device is arranged to detect one end of the conveying region and thereupon signal to the control of the escalator or the moving walkway to terminate moving the conveying assembly.

10. A method for measuring structural components of the bearing structure of the escalator or the moving walkway, the method comprising:

generating a 3D model of the structural components of the bearing using the method of claim 1;

measuring the structural components by way of the 3D model.

11. A method for modernizing the escalator or the moving walkway, the method comprising:

ascertaining dimensions within the bearing structure of the escalator or the moving walkway by measuring structural components of the bearing structure using the method of claim 10;

removing old components from the escalator or the moving walkway attached to the bearing structure;

attaching new components of the escalator or the moving walkway to the bearing structure, wherein positioning of the new components on the bearing structure is effected taking into account the previously ascertained dimensions within the bearing structure.

12. A device for generating a 3D model of structural components of a bearing structure of an escalator or moving walkway, wherein the escalator or the moving walkway comprises a conveying assembly with a plurality of tread units moveable along a revolving travel path, wherein the tread units are arranged one behind the other along the travel path, and, at least in a conveying region in which the tread units can be stepped on by passengers, the tread units are arranged above structural components to be measured, the device comprising:

an image recording device, which is arranged to record image recordings of structural components to be measured, wherein the image recording device is configured to exchange signals with a control of the escalator or the moving walkway in order to coordinate the recording of image recordings with the movement of the conveying assembly;

a fixing means, which is arranged to fix the image recording device on the conveying assembly;

and at least one clearly identifiable reference mark, which can be immovably affixed on the escalator or the moving walkway in at least one place within the travel path; and a processor configured to:

generate the 3D model at least of partial areas of the structural components of the bearing structure based on image recordings recorded by the image recording device with the aid of reference marks recorded along with the image recordings;

generate or insert into the 3D model a component model of at least one replacement component to be installed on the bearing structure; and generate, based on the 3D model and the component model, an adapter plate or adapter module model configured to fit and attach the replacement component to the bearing structure.

13. The device according to claim 12, wherein the image recording device is a 3D image recording device for recording 3D image recordings.

14. The device according to claim 12, wherein the recording of image recordings is coordinated with the movement of the conveying assembly.

15. The device according to claim 13, wherein the recording of image recordings is coordinated with the movement of the conveying assembly.

* * * * *